(12) United States Patent
Villa

(10) Patent No.: US 12,733,515 B2
(45) Date of Patent: Sep. 8, 2026

(54) METHOD OF MANUFACTURING SEMICONDUCTOR DEVICES AND CORRESPONDING SEMICONDUCTOR DEVICE

(71) Applicant: STMicroelectronics S.r.l., Agrate Brianza (IT)

(72) Inventor: Riccardo Villa, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 504 days.

(21) Appl. No.: 18/140,194

(22) Filed: Apr. 27, 2023

(65) Prior Publication Data

US 2023/0361010 A1 Nov. 9, 2023

(30) Foreign Application Priority Data

May 3, 2022 (IT) ........................ 102022000008897

(51) Int. Cl.
*H10W 70/40* (2026.01)
*H10W 40/10* (2026.01)
(Continued)

(52) U.S. Cl.
CPC ......... *H10W 70/461* (2026.01); *H10W 40/10* (2026.01); *H10W 70/464* (2026.01); *H10W 74/01* (2026.01); *H10W 74/114* (2026.01)

(58) Field of Classification Search
CPC ............... H01L 23/49568; H01L 21/56; H01L 23/3121; H01L 23/36; H01L 23/49517;
(Continued)

(56) References Cited

U.S. PATENT DOCUMENTS 5,065,281 A * 11/1991 Hernandez .......... H01L 23/4334 361/813
5,707,894 A * 1/1998 Hsiao .................. H10W 72/019 438/666

(Continued)

FOREIGN PATENT DOCUMENTS

CN 107221515 A 9/2017
CN 208923104 U 5/2019

(Continued)

OTHER PUBLICATIONS

CN First Office Action and Search Report for counterpart CN Appl. No. 202310478688.3, report dated Jul. 23, 2025, 7 pgs.

(Continued)

*Primary Examiner* — Eugene Lee
(74) *Attorney, Agent, or Firm* — Crowe & Dunlevy LLC

(57) ABSTRACT

A semiconductor chip or die is arranged on a first surface of a thermally conductive die pad of a substrate such as a leadframe. An encapsulation of insulating material in molded onto the die pad having the semiconductor die arranged on the first surface. At the second surface of the die pad, opposite the first surface, the encapsulation borders on the die pad at a borderline around the die pad. A recessed portion of the encapsulation is provided, for example, via laser ablation, at the borderline around the die pad. Thermally conductive material such as metal material is filled in the recessed portion of the encapsulation around the die pad. The surface area of the thermally conductive die pad is augmented by the filling of thermally conductive material in the recessed portion of the encapsulation thus improving thermal performance of the device.

18 Claims, 2 Drawing Sheets

(51) Int. Cl.
*H10W 74/01* (2026.01)
*H10W 74/10* (2026.01)

(58) Field of Classification Search
CPC . H10W 70/461; H10W 40/10; H10W 70/464; H10W 74/01; H10W 74/114
See application file for complete search history.

(56) References Cited

U.S. PATENT DOCUMENTS 6,271,581 B2 * 8/2001 Huang ................ H01L 23/4951 257/676
6,599,578 B2 * 7/2003 Peng ................... H10W 72/019 257/784
6,874,910 B2 * 4/2005 Sugimoto ............... H01L 24/97 362/267
7,205,180 B1 * 4/2007 Sirinorakul ......... H10W 74/127 438/622
7,495,322 B2 * 2/2009 Hashimoto ........ H10H 20/8582 362/555
7,714,341 B2 * 5/2010 Chil Keun ............ H01L 25/167 257/E33.072
7,821,027 B2 * 10/2010 Shin ................... H10H 20/8585 257/707
8,410,371 B2 * 4/2013 Andrews ............. H01L 23/3735 361/720
8,823,145 B2 * 9/2014 Shin ..................... H05K 1/0206 257/276
9,123,684 B2 * 9/2015 Liao .................... H01L 21/4871
10,763,398 B2 * 9/2020 Kim ................... H10H 20/8506
11,189,766 B2 * 11/2021 Pun ...................... H10H 20/857
11,910,519 B2 * 2/2024 Kirkpatrick ......... H01L 23/3677
2001/0030363 A1 * 10/2001 Chopra ............... H10W 20/037 257/734
2003/0189830 A1 * 10/2003 Sugimoto .......... H10H 20/8582 362/267
2004/0125579 A1 * 7/2004 Konishi ................ H10W 90/00 257/E23.125
2004/0188696 A1 * 9/2004 Hsing Chen ............ H01L 24/97 257/99
2005/0082561 A1 * 4/2005 Suehiro ................... F21V 29/83 257/E33.072
2006/0131732 A1 * 6/2006 Nah ..................... H05K 1/0206 257/706
2007/0253209 A1 * 11/2007 Loh ...................... H10H 20/857 362/458
2008/0099770 A1 * 5/2008 Mendendorp ........ H05K 1/0206 257/79
2008/0150147 A1 * 6/2008 Adkisson .............. H10W 72/90 257/763
2010/0285636 A1 * 11/2010 Chen ..................... H01L 23/552 257/E21.602
2013/0049181 A1 * 2/2013 Wen .................... H10W 70/411 257/676
2013/0163206 A1 * 6/2013 Kobayashi .......... H10W 40/228 361/709
2014/0027915 A1 * 1/2014 Grille .................... H10P 50/283 257/770
2015/0102479 A1 4/2015 Fuergut et al.
2019/0115287 A1 * 4/2019 Derai ...................... H01L 24/73
2019/0259681 A1 * 8/2019 Hasegawa ........... H01L 23/3107
2021/0305203 A1 9/2021 Graziosi et al.
2022/0077052 A1 * 3/2022 Ge ...................... H10W 70/411
2022/0230944 A1 * 7/2022 Koduri ................ H10W 90/701

FOREIGN PATENT DOCUMENTS

CN 111916408 A 11/2020
CN 114127920 A 3/2022
CN 220510010 U 2/2024

OTHER PUBLICATIONS

IT Search Report and Written Opinion for priority application, IT Appl. 102022000008897, report dated Jan. 4, 2023, 8 pgs.

* cited by examiner

Produce Basic Structure
100
Molding
102
Plating
104
Cropping
106
10
12A
Produce Basic Structure
100
102A
Molding
102'
LDS Processing
102B
Plating
104'
Cropping
106
122A
10
12A

METHOD OF MANUFACTURING SEMICONDUCTOR DEVICES AND CORRESPONDING SEMICONDUCTOR DEVICE

PRIORITY CLAIM

This application claims the priority benefit of Italian Application for Patent No. 102022000008897 filed on May 3, 2022, the content of which is hereby incorporated by reference in its entirety to the maximum extent allowable by law.

TECHNICAL FIELD

The description relates to semiconductor devices.

One or more embodiments can be applied, for instance, to power semiconductor devices, including gallium nitride (GaN) or silicon carbide (SiC) devices.

BACKGROUND

The trend towards semiconductor die miniaturization, as fueled by gallium nitride (GaN) or silicon carbide (SiC) devices for example, leads to seeking improved thermal dissipation performance in packages for small integrated circuit (IC) dice.

An approach to achieve such improved performance may involve die pad enlargement at leadframe design level.

This affects the leadframe dimensions and the length of wires in wire bonding patterns.

Another solution is to rely on leadframes including leads overhanging die pads.

While notionally attractive, this approach may turn out to be quite complex and expensive to implement.

There is a need in the art to contribute in adequately addressing the issues discussed in the foregoing.

SUMMARY

One or more embodiments may relate to a method.

One or more embodiments may relate to a corresponding semiconductor device.

Examples presented herein involve increasing (that is, enlarging) the back or bottom area of a die pad without otherwise affecting die size and die-to-lead bond length.

For instance, a laser beam can be used to form a recess around the periphery of the bottom surface of a die pad. Thermally conductive material (metal as copper, for instance) is filled (for example, grown) in the recess to extend the die pad area on the bottom side of the package.

A seed layer or the full desired thickness of copper can be jet-printed, optionally followed by electroplating.

Laser direct structuring (LDS) material can be used as a package molding material, and thermally conductive material (metal as copper, for instance) can be grown in the recess resorting to conventional in standard LDS processing (electroless plus electroplating).

Thermally conductive material (metal as copper, for instance) can also be grown in the recess resorting to laser-induced forward transfer (LIFT) processing.

The thickness of the die pad extension created can be equal to or different from the thickness of the leadframe die pad.

One or more embodiments involve using molding material compatible with laser direct structuring (LDS).

This processing is applicable in conjunction with conventional molding equipment and known packages. The higher cost of LDS compound hardly affects the total package cost due to the small quantity of LDS material involved and is advantageously less than any cost related to possible package redesign.

Embodiments of the present description being used can be recognized, for example, via a different surface morphology of a basic die pad versus the material grown therearound to increase the die pad size. Leads in a leadframe "overhanging" the die pad may otherwise indicate that the die pad has been enlarged after leadframe manufacturing by additional material grown therearound. Molding compound analysis can otherwise highlight the use of a mold compound compatible with laser direct structuring (LDS) processing.

BRIEF DESCRIPTION OF THE DRAWINGS

One or more embodiments will now be described, by way of example only, with reference to the annexed figures, wherein.

DETAILED DESCRIPTION

Figure 1A:
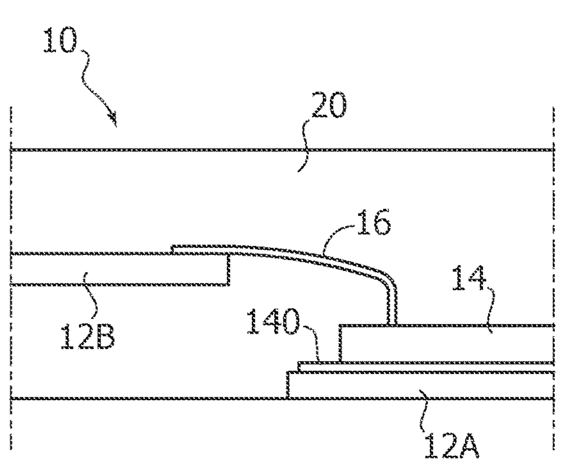
FIG. 1A and FIG. 1B are partial cross-sectional views exemplary of a step or phase in manufacturing semiconductor devices.

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

For simplicity and ease of explanation, throughout this description: like parts or elements are indicated in the various figures with like reference signs, and a corresponding description will not be repeated for each and every figure; and manufacturing a single device will be described, being otherwise understood that current manufacturing processes of semiconductor devices involve manufacturing concurrently plural devices that are separated into single individual devices in a final singulation.

FIGS. 1A-1B, 2A-2B, and 3A-3B are partial cross-sectional views exemplary of certain steps or phases in manufacturing a semiconductor device 10 with a plastic package.

Specifically: the figures on the left (FIGS. 1A, 2A, and 3A) are exemplary of arrangements using wire bonding connections to provide electrical connections to a semiconductor chip or die; and the figures on the right (FIGS. 1B, 2B, and 3B) are exemplary of arrangements wherein electrical connections to a semiconductor chip or die are provided using laser direct structuring (LDS) technology.

As otherwise conventional in the art, the device 10 comprises a substrate (leadframe) having arranged thereon one or more semiconductor chips or dice.

As used herein, the terms chip/s and die/dice, relating to an integrated circuit, are regarded as synonymous.

FIGS. 1A-1B, 2A-2B, and 3A-3B refer by way of example to a semiconductor device comprising a die pad 12A in a leadframe that also includes an array of leads 12B around the die pad 12A having a semiconductor integrated circuit (IC) chip or die 14 attached thereon, for example, via a die attach film (DAF) 140.

The designation "leadframe" (or "lead frame") is currently used (see, for instance the USPC Consolidated Glossary of the United States Patent and Trademark Office) to indicate a metal frame that provides support for an integrated circuit chip or die as well as electrical leads to interconnect the integrated circuit in the chip or die to other electrical components or contacts.

Essentially, a leadframe comprises an array of electrically-conductive formations (or leads, for example, 12B) that from an outline location extend inwardly in the direction of a semiconductor chip or die (for example, 14) thus forming an array of electrically-conductive formations from a die pad (for example, 12A) configured to have—at least one—semiconductor integrated circuit chip or die attached thereon.

Certain semiconductor devices may in fact include plural die pads and/or plural dice or chips attached on the or each die pad: this description refers for simplicity and ease of explanation to a device 10 including a single die pad 12A having attached thereon (at a first surface, facing upwards in the figures) a single chip or die.

Electrically conductive formations are provided to electrically couple the semiconductor chip 14 to selected ones of the leads 12B in the leadframe.

Figure 2A:
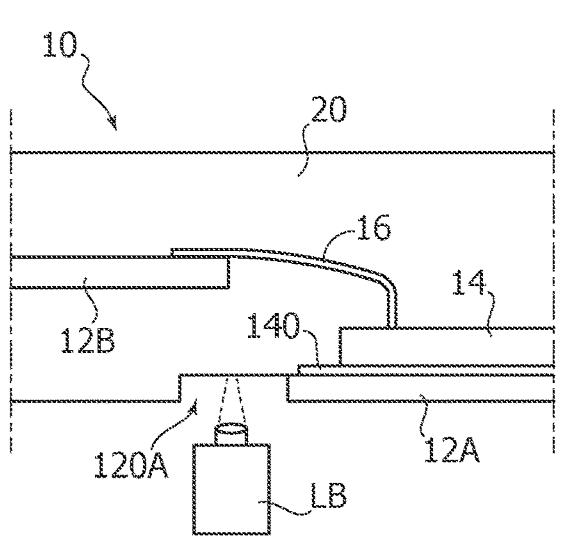
FIG. 2A and FIG. 2B are partial cross-sectional views exemplary of a further step or phase in manufacturing semiconductor devices.
Figure 3A:
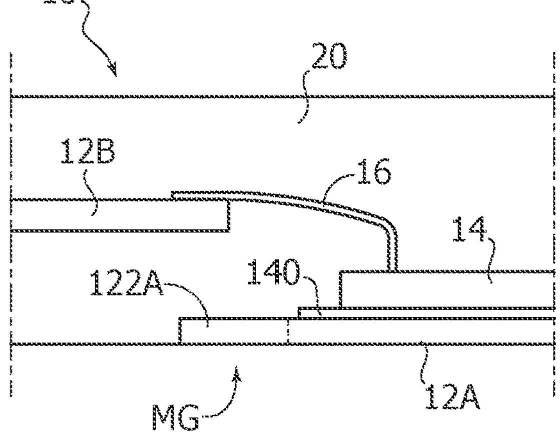
FIG. 3A and FIG. 3B are partial cross-sectional views exemplary of a still further step or phase in manufacturing semiconductor devices.

As illustrated in FIGS. 1A, 2A and 3A, these electrically conductive formations may comprise a wire bonding pattern 16 coupling the chip 14 to selected ones of the leads 12B. The wires in the wire bonding patterns 16 are coupled to die pads (not visible for scale reasons) provided at the front or top surfaces of the chip 14.

An insulating encapsulation 20 (for example, an epoxy resin) is molded on the assembly thus formed to complete the plastic body of the device 10.

Laser direct structuring (LDS—oftentimes referred to also as direct copper interconnection (DCI) technology) is a laser-based machining technique now widely used in various sectors of the industrial and consumer electronics markets, for instance for high-performance antenna integration, where an antenna design can be directly formed onto a molded plastic part.

In an exemplary process, the molded parts can be produced with commercially available insulating resins that include additives suitable for the LDS process; a broad range of resins such as polymer resins like PC, PC/ABS, ABS, LCP are currently available for that purpose.

In LDS, a laser beam can be used to transfer ("structure") a desired electrically-conductive pattern onto a plastic molding that may then be subjected to metallization to finalize a desired conductive pattern.

Metallization may involve electroless plating followed by electrolytic plating.

Electroless plating, also known as chemical plating, is a class of industrial chemical processes that creates metal coatings on various materials by autocatalytic chemical reduction of metal cations in a liquid bath.

In electrolytic plating, an electric field between an anode and a workpiece, acting as a cathode, forces positively charged metal ions to move to the cathode where they give up their charge and deposit themselves as metal on the surface of the work piece.

Reference is made to United States Patent Application Publication Nos. 2018/342453 A1, 2019/115287 A1, 2020/203264 A1, 2020/321274 A1, 2021/050226 A1, 2021/050299 A1, 2021/183748 A1, or 2021/305203 A1 (all incorporated herein by reference) are exemplary of the possibility of applying LDS technology in manufacturing semiconductor devices.

Figure 1B:
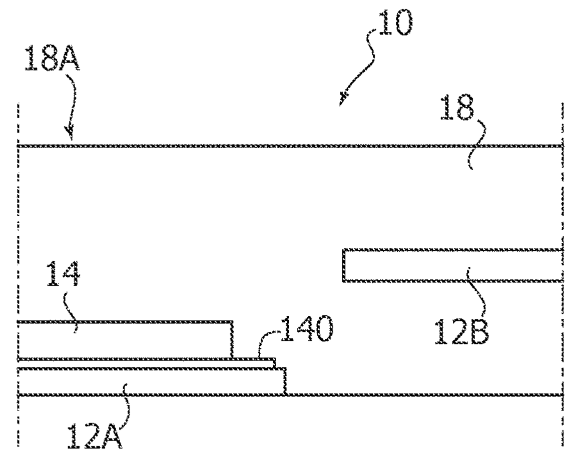
Figure 2B:
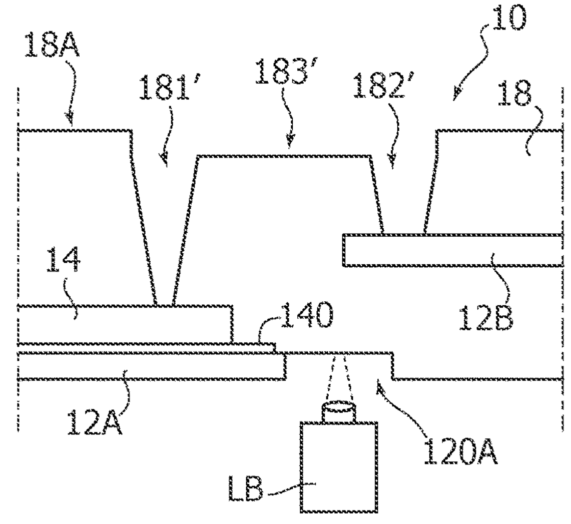
Figure 3B:
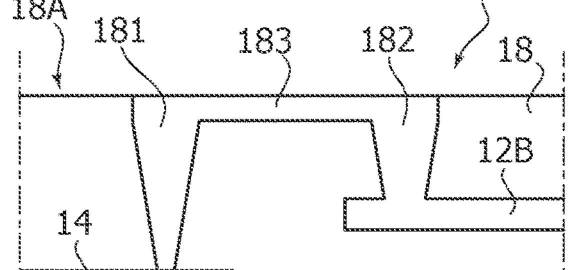

As illustrated in FIGS. 1B, 2B and 3B, LDS technology facilitates replacing wires such as 16 with lines/vias created by laser beam processing of an LDS material followed by metallization (growing metal such as copper via a plating process, for instance).

Electrically conductive die-to-lead coupling formations can be provided (as discussed in the commonly assigned applications cited in the foregoing, for instance) in an insulated encapsulation 18 of LDS material (once consolidated, for example, via thermosetting).

As illustrated in FIGS. 1B, 2B and 3B, these die-to-lead coupling formations comprise: first through-mold vias (TMVs) 181 that extend through the LDS encapsulation 18 between the top (front) surface 18A of the LDS encapsulation 18 and electrically-conductive pads (already mentioned in connection with the wire bonding pattern 16 and not visible for scale reasons) at the front or top surface of the chip or die 14; second through-mold vias (TMVs) 182 that extend through the LDS encapsulation 18 between the top (front) surface 18A of the LDS encapsulation 18 and corresponding leads 12B in the leadframe; and electrically-conductive lines or traces 183 that extend at the front or top surface 18A of the LDS encapsulation 18 and electrically couple selected ones of the first vias 181 with selected ones of the second vias 182 to provide a desired die-to-lead electrical connection (routing) pattern between the chip or die 14 and the leads 12B.

Providing the electrically conductive die-to-lead formations 181, 182, and 183 essentially involves (see FIGS. 2B and 3B): structuring these formations in the LDS material of the encapsulation 18, for instance, by applying laser beam energy to "activate" (and partially drill/ablate) the LDS material 18 at the desired locations 181', 182', 183' for the vias 181, 182 and the lines or traces 183; and growing electrically conductive material (metal such as copper, for instance) at the locations 181', 182', 183' previously activated (structured) via laser beam energy.

Growing electrically conductive material may involve deposition of metal such as copper via electroless/electrolytic metal growth to facilitate electrical conductivity of the structured formations.

Growing electrically conductive material may also be via a Laser-Induced Forward Transfer (LIFT) process which comprises a deposition process where material from a donor tape or sheet is transferred to an acceptor substrate (here, the LDS material) facilitated by laser pulses.

General information on the LIFT process can be found, for instance, in P. Serra, et al.: "Laser-Induced Forward Transfer: Fundamentals and Applications", in Advanced Materials Technologies/Volume 4, Issue 1 (incorporated herein by reference).

The half-split arrangement of FIGS. 1A through 3A and FIGS. 1B through 3B is intended to highlight that the processing leading to augmenting a surface area of (that is, making greater or larger by adding to it, increasing in size) the die pad 12A as discussed in the following can be applied: i) to devices 10 including a wire bonding pattern such as 16 in FIGS. 1A, 2A, and 3A, where the encapsulation 20 may be a conventional encapsulation (for example, an epoxy resin) that insulates the wire bonding pattern 16 (FIGS. 1A, 2A, and 3A); and ii) to devices 10 where the encapsulation 18 is LDS material thus facilitating providing therein the electrically conductive formations 181, 182, and 183 (FIGS. 1B, 2B, and 3B).

A certain device 10 will thus expectedly adopt either one of the solutions i) or ii) above, thus being comprised of: two (roughly) mirror-symmetrical portions, each being as represented in FIGS. 1A, 2A and 3A; or two (roughly) mirror-symmetrical portions, each being as represented in FIGS. 1B, 2B and 3B.

The term "roughly" is intended to take into account the fact that neither a wire bonding pattern such as 16 (in the "wired" version of FIGS. 1A, 2A, and 3A) nor electrically conductive formations such as 181, 182, and 183 (in the "laser structured" version of FIGS. 1B, 2B, and 3B) will necessarily have a strictly mirror-symmetrical routing pattern of wires/lines with respect to any intermediate plane of the device 10.

It will be otherwise appreciated that examples as discussed herein are primarily concerned with package thermal performance of a device such as device 10 rather that with specific details of electrical die-to-lead (or die-to-die) coupling therein.

Package thermal performance of a device 10 as considered herein is determined by package design and material selection and can be modelled based on various parameters.

For instance: theta JA (θja)=junction-to-air thermal resistance; this is a measure of the ability of a device to dissipate heat from the surface of the die to the ambient through all possible paths; theta JC (θjc)=junction-to-case thermal resistance; this is a measure of the ability of a device to dissipate heat from the surface of the die to the top or bottom surface of the package; theta JB (θjb)=thermal resistance from junction to the board onto which the device is mounted; and psi JB (Ψjb) is the junction-to-board thermal-characterization parameter; this is a measure of the power flowing from the device through multiple thermal paths rather than a single direct path, as in thermal resistance.

The parameters introduced in the foregoing are measured in units of ° K/W.

As discussed in the introductory portion to this description, semiconductor (silicon) miniaturization is leading to changes in package design. These involve reducing die pad (or heat sink) dimensions, which—per se—would have a negative effect on thermal performance.

The current trend towards die miniaturization dictates improved (higher) package thermal dissipation, while package design is not always compatible with this specification: when hosting a smaller die, die pad dimensions are reduced to reduce lengths of connections as well.

Indeed, thermal dissipation improves in response to die pad dimensions being increased. New technologies (such as gallium nitride (GaN) or silicon carbide (SiC)) may dictate stricter thermal dissipation specifications, leading to package selection constraints.

Package redesign or changes in package can be considered as an option to address this problem: package redesign however involves higher development costs and may not meet customer requirements.

Other options may involve modification in materials, for example, reduction of die thickness or improvements in die attach materials. These measures are however less effective than package redesign.

Being able to enhance package thermal properties without adversely affecting wire connections and leadframe design (and the range of applicability and customization, thus device flexibility) is thus desirable.

Examples as proposed herein "enlarge" (augment) the back or bottom area of a die pad 12A (facing downwards in FIGS. 1A-1B through 3A-3B) without otherwise affecting die size and die-to-lead bond length.

FIGS. 1A and 1B are exemplary of steps or phases wherein at least one semiconductor chip 14 is arranged on a first surface (facing upwards in the figures) of a thermally conductive (for example, metal as copper) die pad 12A in a substrate (leadframe).

The die pad 12A has a second surface (facing downwards in the figures) opposite the first surface and an encapsulation 18, 20 of insulating material is molded (in a manner known per se to those of skill in the art) onto the die pad 12A having the (at least one) semiconductor chip 14 arranged on the first surface.

As a result of molding, at the second surface of the die pad 12A, the encapsulation 18, borders on the second surface of the die pad 12A (substantially flush therewith) along a borderline around the die pad 12A, that is along the peripheral contour of the second surface of the die pad 12A.

As exemplified in FIGS. 2A and 2B, a recess or groove (continuous/discontinuous) 120A can be formed around the periphery of the second (back or bottom) surface of the die pad 12A.

As exemplified in FIGS. 3A and 3B, thermally conductive material (metal as copper, for instance) is grown (filled-in) in the recess 120A to augment a surface area of (that is, to make greater by adding to it and thus increase) the die pad area at the bottom side of the package as indicated by 122A.

This concept, namely: provides a (continuous/discontinuous) recessed portion 120A of the encapsulation 18, 20 around the periphery of the second (back or bottom) surface of the die pad 12A, for example, by removing insulating material from the encapsulation 18, 20 molded onto the die pad 12A at the borderline to the second surface of the die pad 12A to provide a recessed portion 120A of the encapsulation 18, 20 around the die pad 12A or in other ways (for example, via molding); fills thermally conductive material 122A in the recessed portion 120A of the encapsulation 18, 20 around the die pad 12A to augment a surface area of the thermally conductive die pad 12A by filling therein thermally conductive material 122A; and lends itself to being implemented in different ways: whatever the specific implementation options, the thickness of the die pad extension indicated by the reference 122A can be different from or the same thickness of the die pad 12A.

Forming the recess 120A may involve, for instance, selectively removing encapsulation material.

Ablation via laser beam, as schematically represented at LB in FIGS. 2A and 2B, was found to be advantageous in view of its flexibility (for example, etching masks can be dispensed with).

Growing (filling-in) thermally conductive material 122A in the recess 120A as schematically represented at MG in FIGS. 3A and 3B, can be likewise implemented in different ways.

For example, a seed layer or the full desired thickness of material such as copper can be jet-printed into the recess 120A, optionally followed by electroplating.

Using laser direct structuring (LDS) material for the encapsulation 18 represents an advantageous option insofar as: laser beam energy LB as used to form the recess 120A in the encapsulation 18 at the back or bottom surface of the device 10 can be likewise used to "structure" therein, (by "activating" the LDS material) at the front or top surface 18A, the through-mold vias 181, 182 and the lines or traces 183 (see 181', 182' and 183' FIG. 2B); and a same process, such as plating (electroless plus electrolytic deposition, for instance) or LIFT processing can be used to grow electrically/thermally conductive material (metal such as copper, for instance) both at the recess 120A to extend the—heat dissipating—die pad area at the bottom side of the package at 122A and to facilitate electrical conductivity of the vias 181, 182 and the lines or traces 183 at the front or top surface of the device 10 (see FIG. 2B).

Laser direct structuring (LDS) material can be used also for an encapsulation 20 as illustrated in FIGS. 1A, 2A and 3A, that is an encapsulation intended to encapsulate a wire bonding pattern such as the wire bonding pattern 16 in a "wired" version of the device 10.

Also in this latter case, laser beam energy LB can be used to drill/ablate) LDS material of the encapsulation to form the recess 120A with, for example, plating (electroless plus electrolytic deposition, for instance), LIFT processing (or jet-printing) used to grow electrically/thermally conductive material at the recess 120A to extend the—heat dissipating—die pad area at the bottom side of the package at 122A.

It is noted that laser beam energy LB drills/ablates some LDS material (thus providing a shaping effect or action) and, in doing so, also activates the LDS material (thus influencing the properties of the surface of the LDS molding compound.

Laser direct structuring (LDS) is applicable in conjunction with conventional mold equipment and known packages.

Examples as presented herein facilitate enlarging the area of a die pad 12A without otherwise affecting package design. Die pad enlargement is performed after molding and does not affect leadframe design. Leadframe features (like short connections from die to lead) can be maintained with thermal dissipation performance improved.

Figures 4, 5:
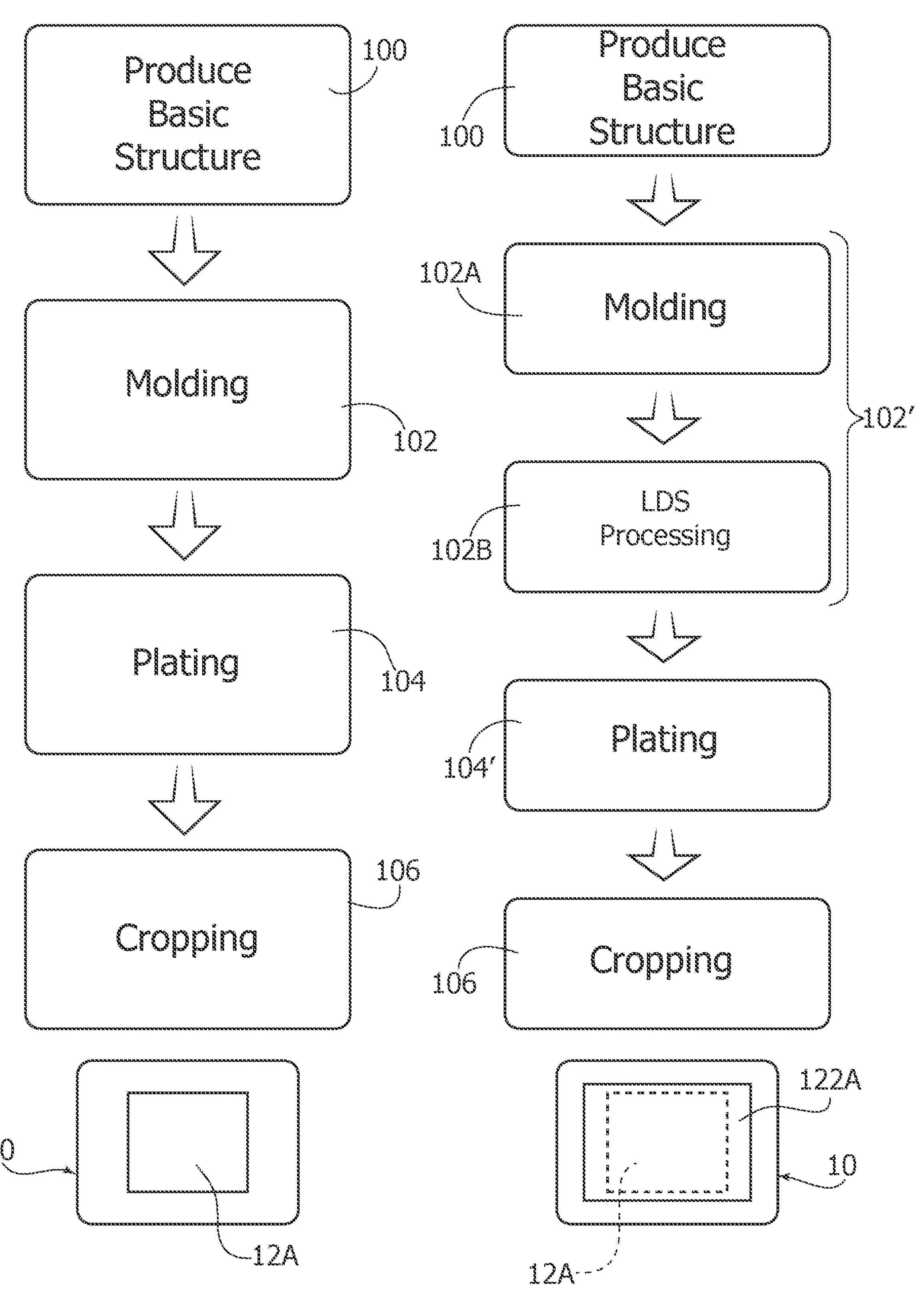
FIGS. 4 and 5 are functional flow charts comparing a conventional sequence of steps in manufacturing semiconductor devices and a sequence of steps in manufacturing semiconductor devices according to embodiments of the present description.

This is evidenced by the functional flow charts of FIGS. 4 and 5. These flow charts refer to a conventional sequence of steps in manufacturing semiconductor devices (FIG. 4) and a sequence of steps in manufacturing semiconductor devices according to embodiments of the present description (FIG. 5), respectively.

It will be otherwise appreciated that the sequences of steps of FIGS. 4 and 5 are merely exemplary insofar as: one or more steps illustrated therein can be omitted, performed in a different manner (with other tools, for instance) and/or replaced by other steps; additional steps may be added; and one or more steps can be carried out in a sequence different from the sequence illustrated.

In both FIGS. 4 and 5, block 100 indicates collectively those steps that—in a manner known to those of skill in the art—produce the basic structure of a semiconductor device (for example, attaching one or more chips or dice 14 on a die pad 12A, and so on) prior to molding thereon an insulating encapsulation.

This step (for example, molding a conventional encapsulation 20 of an epoxy resin, for instance) is indicated at 102 in FIG. 4 followed by (tin) plating and "cropping" as represented by blocks 104 and 106, respectively, in FIG. 4.

A resulting "standard" die pad 12A is shown at the bottom of FIG. 4: this can be regarded as a schematic view of a device 10 as observed from its back or bottom side.

In the exemplary case presented in FIG. 5 block 100 is followed by a sequence 102' of a molding step of an encapsulation of LDS material 18 followed by LDS processing at 102B.

As discussed previously in connection with FIGS. 2B and 3B, such processing may involve applying laser beam energy LB to form the recess 120A at the back or bottom surface of the device 10 and to structure the vias 181, 182 and the lines or traces 183 at the front or top surface of the device 10.

In FIG. 5, plating at 104' may denote copper plating+tin plating (electroless plus electrolytic deposition, for instance) or LIFT processing used to grow electrically/thermally conductive material (metal such as copper, for instance) both at the recess 120A to extend the—heat dissipating—die pad area at the bottom side of the package at 122A and to facilitate electrical conductivity of the vias 181, 182 and the lines or traces 183 at the front or top surface of the device 10.

A resulting standard die pad 12A "augmented" in surface area at 122A is shown at the bottom of FIG. 5: this can be regarded as a schematic view of a device 10 as observed from its back or bottom side.

While represented here as a continuous and contiguous frame surrounding the original die pad 12A, in certain embodiments the augmented portion 122A may be discontinuous (that is comprise plural segments or dots in a dashed/dotted pattern) and/or non-contiguous (that is, have a separation gap) to the original die pad 12A.

It will be appreciated that enlarging the die pad 12A at 122A (thus improving the thermal dissipation of the device 10) takes place without increasing the overall size of the device and, more to the point, without increasing the length of the electrical connection paths (for example, wires 16 or "LDS-structured" formations 181, 182, 183) between the semiconductor chip 14 and the leads 12B.

In fact, as visible in the examples presented herein, the leads 12B can be caused to project above (overhang) the enlarged portion 122A of the die pad 12A.

The examples presented herein can be virtually applied to any leadframe-based plastic package.

The table below report comparison data obtained via TRAC simulation for a PSSO36 package with die dimensions in μm (X by Y by Z): 4,182 by 3,262 by 375. Wired version. Die attach material: soft solder.

| Option | Die pad X by Y (mm) | θja °K/W | Ψjc_top °K/W | Ψjb °K/W | θja_bot °K/W | θjc_top °K/W | θjb °K/W |
|---|---|---|---|---|---|---|---|
| Reference die pad (12A) | 5.2 × 4.4 | 25.6 | 2 | 9.6 | 1.2 | 25.7 | 9.7 |
| Enlarged die pad (12A + 122A) | 7.2 × 4.9 | 23.1 | 1.5 | 7.3 | 1.1 | 23.2 | 7.4 |

Without prejudice to the underlying principles, the details and embodiments may vary, even significantly, with respect to what has been described by way of example only without departing from the extent of protection.

The extent of protection is determined by the annexed claims.

The claims are an integral part of the technical teaching on the embodiments as provided herein.

The invention claimed is:

1. A method, comprising:

arranging a semiconductor integrated circuit die on a first surface of a thermally conductive die pad of a lead frame, the thermally conductive die pad having a second surface opposite the first surface;

molding an encapsulation of insulating material onto the thermally conductive die pad, wherein, at the second surface of the thermally conductive die pad, the encapsulation borders on the thermally conductive die pad at a borderline around the thermally conductive die pad;

removing insulating material from the encapsulation molded onto the thermally conductive die pad at said borderline around the thermally conductive die pad to provide a recessed portion of the encapsulation around the thermally conductive die pad; and filling thermally and electrically conductive material in said recessed portion of the encapsulation;

wherein a surface area of the thermally conductive die pad at said second surface is augmented by thermally and electrically conductive material in said recessed portion of the encapsulation.

2. The method of claim 1, wherein filling thermally and electrically conductive material comprises one of:

jet printing thermally and electrically conductive material at said recessed portion;

plating thermally and electrically conductive material at said recessed portion; or laser-induced forward transfer of thermally and electrically conductive material at said recessed portion.

3. The method of claim 1, wherein removing comprises applying laser beam energy to the encapsulation.

4. The method of claim 1, wherein the insulating material of the encapsulation comprises laser direct structuring (LDS) material, and wherein removing comprises applying a laser structuring to the LDS material of the encapsulation at said borderline around the thermally conductive die pad.

5. The method of claim 4, wherein the LDS material of the encapsulation has a front surface opposite the thermally conductive die pad, and further comprising:

structuring, in the LDS material of the encapsulation, through-mold vias extending into the encapsulation from said front surface; and structuring, in the LDS material of the encapsulation, connecting lines extending over said front surface between selected ones of the through-mold vias.

6. The method of claim 5, further comprising:

applying laser beam energy to the LDS material of the encapsulation at candidate locations for said through-mold vias and connecting lines; and subsequent to applying laser beam energy, filling electrically conductive material at said candidate locations to provide electrically conductive through-mold vias and connecting lines at said candidate locations.

7. The method of claim 6, wherein filling electrically conductive material comprises:

plating electrically conductive material at said candidate locations; or laser-induced forward transfer of thermally conductive material at said candidate locations.

8. The method of claim 1 wherein the thermally and electrically conductive material filled in said recessed portion of the encapsulation has a thickness different from the thickness of the thermally conductive die pad.

9. The method of claim 1, wherein said lead frame includes an array of electrically conductive leads surrounding the thermally conductive die pad, and wherein the electrically conductive leads project above the thermally and electrically conductive material filled in said recessed portion of the encapsulation.

10. The method of claim 1, wherein said thermally conductive die pad is made of an electrically conductive material.

11. A method, comprising:

arranging a semiconductor integrated circuit die on a first surface of a thermally conductive die pad of a lead frame, the thermally conductive die pad having a second surface opposite the first surface;

molding an encapsulation of insulating material onto the thermally conductive die pad;

wherein a bottom surface of the encapsulation and the second surface of the thermally conductive die pad are coplanar;

removing insulating material of the encapsulation from the bottom surface of the encapsulation at a borderline around the thermally conductive die pad to form a recessed portion of the encapsulation around the thermally conductive die pad; and filling the recessed portion with a thermally and electrically conductive material to augment a surface area of the thermally conductive die pad at the bottom surface of the encapsulation;

wherein the thermally and electrically conductive material filling the recessed portion has a bottom surface coplanar with both the bottom surface of the encapsulation and the second surface of the thermally conductive die pad.

12. The method of claim 11, wherein filling thermally and electrically conductive material comprises jet printing thermally and electrically conductive material at said recessed portion.

13. The method of claim 11, wherein filling thermally and electrically conductive material comprises plating thermally and electrically conductive material at said recessed portion.

14. The method of claim 11, wherein filling thermally and electrically conductive material comprises laser-induced forward transfer of thermally and electrically conductive material at said recessed portion.

15. The method of claim 11, wherein the insulating material of the encapsulation comprises laser direct structuring (LDS) material, and wherein removing comprises applying a laser structuring to the LDS material of the encapsulation at said borderline around the thermally conductive die pad.

16. The method of claim 15, wherein filling thermally and electrically conductive material comprises plating thermally and electrically conductive material at said recessed portion in the laser structured LDS material.

17. The method of claim 11, wherein the thermally and electrically conductive material filled in said recessed portion of the encapsulation has a thickness different from the thickness of the thermally conductive die pad.

18. The method of claim 11, wherein said lead frame includes an array of electrically conductive leads surrounding the thermally conductive die pad, and wherein the electrically conductive leads project above the thermally and electrically conductive material filled in said recessed portion of the encapsulation.

* * * * *